(12) United States Patent
Yun et al.

(10) Patent No.: US 11,404,182 B2
(45) Date of Patent: Aug. 2, 2022

(54) CONDUCTIVE COMPOSITE STRUCTURE FOR ELECTRONIC DEVICE, METHOD OF PREPARING THE SAME, ELECTRODE FOR ELECTRONIC DEVICE INCLUDING THE CONDUCTIVE COMPOSITE STRUCTURE, AND ELECTRONIC DEVICE INCLUDING THE CONDUCTIVE COMPOSITE STRUCTURE

(71) Applicant: Samsung Electronics Co., Ltd., Suwon-si (KR)

(72) Inventors: Dongjin Yun, Pohang-si (KR); Seyun Kim, Seoul (KR); Minsu Seol, Seoul (KR); Changseok Lee, Seoul (KR); Seongheon Kim, Seongnam-si (KR); Hyangsook Lee, Suwon-si (KR); Changhoon Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 23 days.

(21) Appl. No.: 16/162,488

(22) Filed: Oct. 17, 2018

(65) Prior Publication Data

US 2019/0131030 A1    May 2, 2019

(30) Foreign Application Priority Data

Oct. 31, 2017    (KR) .................. 10-2017-0144219

(51) Int. Cl.
| | |
|---|---|
| H01B 1/20 | (2006.01) |
| H01L 51/50 | (2006.01) |
| H01B 1/24 | (2006.01) |
| C08L 25/18 | (2006.01) |
| C08K 3/04 | (2006.01) |
| H01L 51/10 | (2006.01) |
| H01L 51/44 | (2006.01) |
| H01L 51/52 | (2006.01) |
| C08L 65/00 | (2006.01) |
| C08G 61/12 | (2006.01) |
| C08G 65/26 | (2006.01) |
| H01L 51/00 | (2006.01) |

(52) U.S. Cl.
CPC .............. *H01B 1/24* (2013.01); *C08K 3/042* (2017.05); *C08L 25/18* (2013.01); *C08L 65/00* (2013.01); *H01L 51/102* (2013.01); *H01L 51/442* (2013.01); *H01L 51/5206* (2013.01); *H01L 51/5218* (2013.01); *H01L 51/5234* (2013.01); *C08G 61/126* (2013.01); *C08G 65/2636* (2013.01); *C08G 2261/1424* (2013.01); *C08G 2261/3223* (2013.01); *C08G 2261/512* (2013.01); *C08G 2261/792* (2013.01); *C08G 2261/794* (2013.01); *C08G 2261/91* (2013.01); *C08G 2261/92* (2013.01); *C08G 2261/95* (2013.01); *C08K 2201/001* (2013.01); *H01L 51/0037* (2013.01)

(58) Field of Classification Search
CPC ..... H01L 51/50; H01L 51/5092; H01L 51/52; H01L 51/54; H01L 29/41; H01L 51/5203; H01L 29/40; H01B 1/24
See application file for complete search history.

(56) References Cited

U.S. PATENT DOCUMENTS

| | | | |
|---|---|---|---|
| 8,421,231 B2 | 4/2013 | Ho et al. | |
| 9,178,170 B2 | 11/2015 | Yan et al. | |
| 9,548,466 B2 | 1/2017 | Park et al. | |
| 2013/0022811 A1* | 1/2013 | Ahn ..................... | B82Y 30/00 |
| | | | 428/336 |
| 2015/0241908 A1 | 8/2015 | Ozyilmaz et al. | |
| 2016/0064672 A1* | 3/2016 | Lee ..................... | H01L 51/0021 |
| | | | 257/40 |

FOREIGN PATENT DOCUMENTS

| | | | |
|---|---|---|---|
| CN | 102621206 A | * | 8/2012 |
| KR | 10-2013-0016846 A | | 2/2013 |
| KR | 10-2014-0083081 A | | 7/2014 |
| KR | 10-1449746 B1 | | 10/2014 |
| KR | 10-2015-0092047 A | | 8/2015 |
| KR | 10-1584222 B1 | | 1/2016 |

OTHER PUBLICATIONS

Ionic liquid-doped poly(3,4-ethylenedioxythiophene) counter electrodes for dye-sensitized solar cells: Cationic and anionic effects on the photovoltaic performance, Li et al., Nano Energy, vol. 9, Oct. 2014, pp. 1-14. (Year: 2014).*
A Transparent, Flexible, Low-Temperature, and SolutionProcessible Graphene Composite Electrode, Chang et al., Adv. Funct. Mater. 2010, 20, 2893-2902. (Year: 2010).*
Improved functionality of PEDOT:PSS thin films via graphene doping, fabricated by ultrasonic substrate vibration-assisted spray coating, Chen et al, Synthetic Metals vol. 222, Part B, Dec. 2016, pp. 309-317. Supplemental Information. (Year: 2016).*
Machine translation of CN102621206.*
Flexible white phosphorescent organic light emitting diodes based on multilayered graphene/PEDOT:PSS transparent conducting film, X. Wu et al. / Applied Surface Science 295 (2014) 214-218.*
Application of solvent modified PEDOT:PSS to graphene electrodes in organic solar cells, Park et al., Nanoscale, 2013, 5, 8934-8939.*

(Continued)

*Primary Examiner* — Haidung D Nguyen
(74) *Attorney, Agent, or Firm* — Harness, Dickey & Pierce, P.L.C.

(57) ABSTRACT

Provided are a conductive composite structure for an electronic device, a method of preparing the conductive composite structure, an electrode for an electronic device including the conductive composite structure, and an electronic device including the conductive composite structure. The conductive composite structure may contain graphene and an organic composite layer including a conductive polymer having a work function of about 5.3 eV or lower, and has a sheet resistance deviation of about 10% or less.

13 Claims, 21 Drawing Sheets

(56) References Cited

OTHER PUBLICATIONS

Fabrication of Free-Standing Multilayered Graphene and Poly(3,4-ethylenedioxythiophene) Composite Films with Enhanced Conductive and Mechanical Properties, Choi et al., Langmuir 2010, 26 (15), 12902-12908.*

Organic Solar Cells with Graphene Electrodes and Vapor Printed Poly(3,4-ethylenedioxythiophene) as the Hole Transporting Layers, Park et al., ACSNano, vol. 6, No. 7, 6370-6377, 2012.*

Enhanced power factor of poly (3,4-ethyldioxythiophene):poly(styrene sulfonate) (PEDOT:PSS)/RTCVD graphene hybrid films, Park et al., Organic Electronics 36 (2016) 166-170.*

Altin, Yasin et al. "Solution-processed transparent conducting electrodes with graphene, silver nanowires and PEDOT:PSS as alternative to ITO." *Surface & Coatings Technology* 302 (2016): 75-81.

Bae, Sukang et al. "Roll-to-roll production of 30-inch graphene films for transparent electrodes." *Nature Nanotechnology* 5 (2010): 574-578.

Hu, Tao et al. "A High Reliability PEDOT:PSS/Graphene Transparent Electrode for Liquid Crystal Displays." *SID 2017 Digest* (2017): 972-975.

Kim, Se Hyun et al. "Tuning the Work Function of Printed Polymer Electrodes by Introducing a Fluorinated Polymer to Enhance the Operational Stability in Bottom-Contact Organic Field-Effect Transistors." *ACS Applied Materials & Interfaces* 9 (2017): 12637-12646.

Sarker, Ashis K. et al. "Hydroiodic acid treated PEDOT:PSDS thin film as transparent electrode: an approach towards ITO free organic photovoltaics." *RSC Advances* 5 (2015): 52019-52025.

Smajdor, Joanna et al. "Voltammetric Electrode Based on Nafion and Poly(2,3-dihydrothieno-1,4-dioxin)-poly(styrenesulfonate) Film for Fast and High Sensitive Determination of Metamizole." *Journal of the Electrochemical Society* 163.5 (2016): B146-B152.

Wu, Xiaoxiao et al. "Flexible white phosphorescent organic light emitting diodes based on multilayered graphene/PEDOT:PSS transparent conducting film." *Applied Surface Science* 295 (2014): 214-218.

Happich, Julien. "See-through flexible e-skin is powered by underlying photovoltaics." Mar. 24, 2017. Website: http://www.eenewseurope.com/news/see-through-flexible-e-skin-powered-underlying-photovoltaics (accessed Oct. 30, 2018).

* cited by examiner

CONDUCTIVE COMPOSITE STRUCTURE FOR ELECTRONIC DEVICE, METHOD OF PREPARING THE SAME, ELECTRODE FOR ELECTRONIC DEVICE INCLUDING THE CONDUCTIVE COMPOSITE STRUCTURE, AND ELECTRONIC DEVICE INCLUDING THE CONDUCTIVE COMPOSITE STRUCTURE

CROSS-REFERENCE TO RELATED APPLICATION

This application claims the benefit of Korean Patent Application No. 10-2017-0144219, filed on Oct. 31, 2017, in the Korean Intellectual Property Office, the disclosure of which is incorporated herein in its entirety by reference.

BACKGROUND

1. Field

The present disclosure relates to a conductive composite structure for electronic devices, a method of preparing the conductive composite structure, an electrode for electronic devices including the conductive composite structure, and an electronic device including the conductive composite structure.

2. Description of the Related Art

In order to use graphene as a transparent electrode, conductivity of the graphene should be improved while maintaining high optical transmittance of the graphene. However, when a dopant is doped or coated on graphene to increase conductivity of the graphene, the dopant cannot be uniformly disposed on the graphene, and thus the improvement in conductivity may not be satisfactory.

SUMMARY

Provided is a conductive composite structure having improved conductivity.

Provided is a method of preparing the conductive composite structure.

Provided is an electrode for an electronic device including the conductive composite structure.

Provided is an electronic device having improved performance by including the conductive composite structure.

Additional aspects will be set forth in part in the description which follows and, in part, will be apparent from the description, or may be learned by practice of the presented embodiments.

According to an aspect of an embodiment, a conductive composite structure for an electronic device includes graphene; and an organic composite layer including a conductive polymer having a work function of about 5.3 eV or lower, wherein a sheet resistance deviation of the conductive composite structure is about 10% or less.

According to an aspect of another embodiment, a method of preparing a conductive composite structure includes mixing a conductive polymer having a work function of about 5.3 eV or lower, isopropyl alcohol, and an organic solvent miscible with isopropyl alcohol to prepare a composition for forming an organic composite layer; and coating and drying the composition for forming an organic composite layer on a supporting member or graphene, wherein an amount of the isopropyl alcohol is in a range of about 100 parts to about 5000 parts by volume based on 100 parts by volume of the conductive polymer having a work function of about 5.3 eV or lower, and an amount of the organic solvent miscible with isopropyl alcohol is about 5 parts by volume based on 100 parts by volume of the conductive polymer having a work function of about 5.3 eV or lower.

According to an aspect of another embodiment, an electrode for an electronic device includes the conductive composite structure.

According to an aspect of another embodiment, an electronic device includes the conductive composite structure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
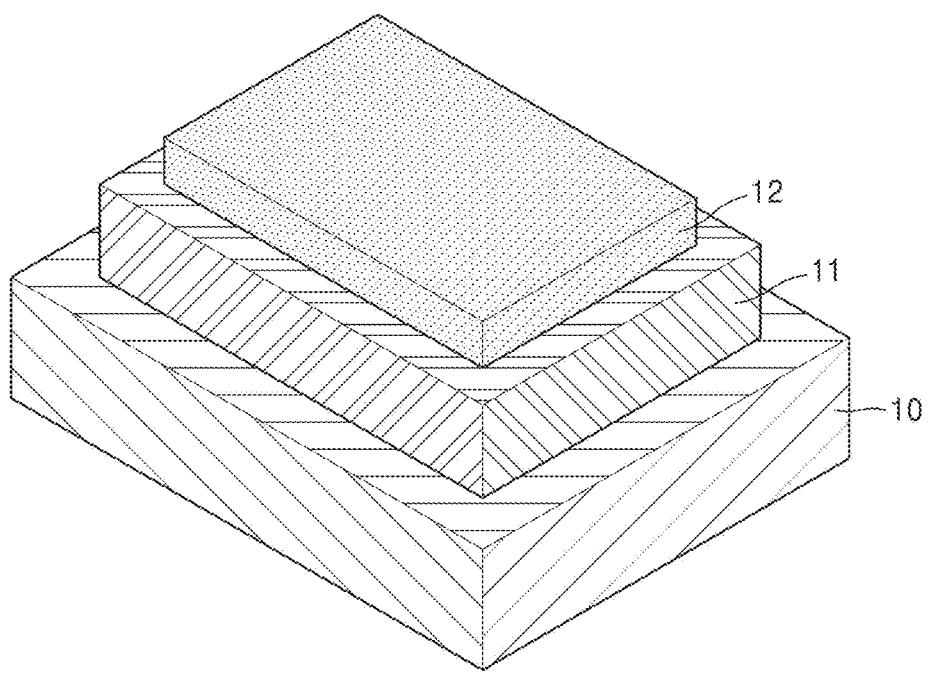
FIG. 1A shows a stacked structure of a conductive composite structure according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, according to one or more embodiments, a conductive composite structure for electronic devices, a method of preparing the conductive composite structure, an electrode for electronic devices including the conductive composite structure, and an electronic device including the conductive composite structure will be described.

According to an embodiment, a conductive composite structure for electronic devices include graphene and an organic composite layer including a conductive polymer having a work function of about 5.3 eV or lower, wherein a sheet resistance deviation of the conductive composite structure is about 10% or less. The conductive composite structure may be a structure in which graphene and the organic composite layer are alternately and repeatedly stacked.

In order to use graphene as an electrode, a conductivity of graphene should be increased, and thus coating a conductive material on graphene has been attempted. However, the conductive material may not be easily coated on graphene, which is hydrophobic, and problems regarding stability of doping effect and an increase of haze may occur.

Aspects of embodiments disclose an organic composite layer composition that may be more evenly coated on hydrophobic graphene by forming an organic composite layer containing a hydrophilic conductive polymer that may improve a conductivity of graphene, on graphene. Also, aspects of embodiments disclose a conductive composite structure by forming an organic composite layer using the composition.

The conductive composite structure according to an embodiment may further decrease resistance and/or a sheet resistance deviation of graphene while maintaining sufficient transparency of graphene so that graphene may be used as a transparent electrode. Also, the conductive composite structure may compensate for a resistance difference for each location caused by tears that occur while transferring the graphene, and thus a sheet resistance deviation of the graphene may be reduced.

As used herein, the "sheet resistance deviation" represents a sheet resistance difference of each region with respect to an average sheet resistance at each region after measuring sheet resistances at 5 regions of the conductive composite structure and calculating the average sheet resistance. The smaller the sheet resistance deviation, the sheet resistance for each region is even. For example, a resistance of the conductive composite structure is 1,000 Ω/square or lower, or, for example, in a range of about 500 Ω/square to about 1,000 Ω/square, and a transmittance of the conductive composite structure is about 98% or higher at 550 nm. A surface roughness of the conductive composite structure is in a range of about 2 nm to about 5 nm. When the conductive composite structure having a surface roughness within this range is used, a binding strength of the conductive composite structure to another layer may be improved.

A work function of the conductive polymer may be in a range of, for example, about 4.9 eV to about 5.3 eV, or, for example, about 5.2 eV to about 5.3 eV. For example, the conductive polymer may be at least one selected from a polyacetylene-based polymer, a polyphenylenevinylene-based polymer, polyaniline, a polypyrrole-based polymer, a polythiophene-based polymer, a polythiophenevinylene-based polymer, and poly(3,4-ethylenedioxythiophene):poly(styrenesulfonate) (PEDOT:PSS).

The organic composite layer may further include Nafion. An amount of Nafion may be in a range of about 5 parts to about 30 parts by weight, or, for example, about 10 parts to about 20 parts by weight, based on 100 parts by weight of the conductive polymer having a work function of about 5.3 eV or lower. When the amount of Nafion is within these ranges, a layer forming property of the organic composite layer with respect to hydrophobic graphene may be improved, and conductivity improving effect of the organic composite layer may be improved.

The organic composite layer may further include at least one dopant selected from an ionic liquid, a polymer ionic liquid, and gold chloride. When the organic composite layer further includes a dopant, a p-type doping effect of graphene may be obtained by surface coating of the organic composite layer. Also, the organic composite layer formed on graphene may include the conductive polymer and thus may serve as a charge migration pathway at a partially damaged part of the graphene. Further, when the dopant exists in an interface of graphene and the organic composite layer, conductivities of both graphene and the organic composite layer may be improved.

An amount of dopant may be in a range of, for example, about 0.1 parts to about 20 parts by weight, for example, about 1 part to about 10 parts by weight, or, for example, about 1 part to about 5 parts by weight, based on 100 parts by weight of the conductive polymer having a work function of about 5.3 eV or lower. A thickness of the organic composite layer may be controlled by controlling a mixing ratio of isopropyl alcohol and a solvent that is being mixed with isopropyl alcohol that are used in preparation of the organic composite layer during a preparation process of the conductive composite structure. For example, a thickness of the organic composite layer may be about 20 nm or less, for example, about 5 nm or less, or, for example, in a range of about 0.01 nm to about 5 nm. When the thickness of the organic composite layer is within these ranges, the organic composite layer may be suitable for a transparent electrode.

Graphene may be a monolayer or a multi-layer. For example, graphene may have 3 layers or less or 3 to 10 layers. Graphene may be prepared in the same manner generally used in the art. Graphene may be prepared by using a wet transfer method or a dry transfer method. Examples of a method that transfers a graphene film prepared by using a chemical vapor deposition (CVD) method on a supporting member or an organic composite layer may include a dry transfer method using a stamp or a wet method that directly transfers graphene floating on water. The dry transfer method generally undergoes moving graphene with a metal catalyst to a stamp, etching the metal, printing, and moving the resultant to a desired substrate. Whereas, the wet transfer method floats the whole substrate on an etching solution so that graphene continuously floats on water after etching both a silicon oxide layer and a metal catalyst layer, dips a substrate, to which the graphene is to be transferred, in the water on which the graphene floats, and scoops up the graphene floating on water with the substrate to transfer the graphene film on the substrate. Also, when a binding strength between graphene and a substrate is good, a method of pressing graphene down, as if stamping, on the substrate may be used.

As described above, graphene may be transferred by using a wet transfer method (hereinafter, this graphene may be also referred to as "wet-transferred graphene") or that transferred by using a dry transfer method (hereinafter, this graphene may be also referred to as "dry-transferred graphene").

As used herein, the term "graphene" refers to a polycyclic aromatic molecule having a plurality of carbon atoms that are arranged in a 2-dimensional layer and covalently bonded to each other. In graphene, carbon nanostructures that form a polycyclic aromatic molecule may form a sheet-like structure of a single atomic layer, or a plurality of carbon nanostructures in the form of plate-like shapes of small film pieces are connected to each other and are arranged in a 2-dimensional layer to form a network structure, which may be used in combination. The covalently bonded carbon atoms may form a six-membered ring as a basic repeating unit, but a five-membered ring and/or a seven-membered ring may also be formed. The carbon nanostructure may have a multi-layer in which a plurality of sheet-like structures and/or network structures are staked, and an average thickness of the carbon nanostructure may be about 100 nm or less, for example, about 10 nm or less, or, for example, in a range of about 0.01 nm to about 10 nm.

Graphene may have a size in a range of about 1 nm to about 50 nm, for example, about 1 nm to about 30 nm, about 1 nm to about 10 nm, or about 5 nm to about 8 nm, and may have three hundred layers or less, for example, a monolayer, ten layers or less, three layers or less, or three to ten layers. For example, graphene may include both graphene nanoparticle (GNP) and graphene nanoquantum dot (GQD).

In some embodiments, when the conductive composite structure is used as a transparent electrode, graphene may be a monolayer or may have ten layers or less, for example, three to ten layers, or, for example, three layers or less, so as to maintain the transparency of the electrode.

The ionic liquid refers to a salt in a liquid state at room temperature or a fused salt at room temperature that includes only ions having a melting point equal to or below room temperature. The ionic liquid may be at least one selected from compounds including i) at least one cation selected from an ammonium-based cation, a pyrrolidinium-based cation, a pyridinium-based cation, a pyrimidinium-based cation, an imidazolium-based cation, a piperidinium-based cation, a pyrazolium-based cation, an oxazolium-based cation, a pyridazinium-based cation, a phosphonium-based cation, a sulfonium-based cation, a triazolium-based cation, and a mixture thereof; and ii) at least one anion selected from BF4-, PF6-, AsF6-, SbF6-, AlCl4-, HSO4-, ClO4-, CH3SO3-, CF3CO2-, Cl—, Br—, I—, SO4-, CF3SO3-, (FSO2)2N—, (C2F5SO2)2N—, (C2F5SO2)(CF3SO2)N—, and (CF3SO2)2N—.

For example, the ionic liquid may be at least one selected from the group consisting of N-methyl-N-propylpyrrolidinium bis(trifluoromethanesulfonyl)imide, N-butyl-N-methylpyrrolidium bis(3-trifluoromethylsulfonyl)imide, 1-butyl-3-methylimidazolium bis(trifluoromethylsulfonyl)imide, and 1-ethyl-3-methylimidazolium bis(trifluoromethylsulfonyl)amide.

In embodiments, the ionic liquid may contain a repeating unit including i) at least one cation selected from an ammonium-based cation, a pyrrolidinium-based cation, a pyridinium-based cation, a pyrimidinium-based cation, an imidazolium-based cation, a piperidinium-based cation, a pyrazolium-based cation, an oxazolium-based cation, a pyridazinium-based cation, a phosphonium-based cation, a sulfonium-based cation, a triazolium-based cation, and a mixture thereof; and ii) at least one anion selected from BF4-, PF6-, AsF6-, SbF6-, AlCl4-, HSO4-, ClO4-, CH3SO3-, CF3CO2-, (CF3SO2)2N—, (FSO2)2N—, Cl—, Br—, I—, SO4-, CF3SO3-, (C2F5SO2)2N—, (C2F5SO2)(CF3SO2)N—, NO3-, Al2Cl7-, (CF3SO2)3C—, (CF3)2PF4-, (CF3)3PF3-, (CF3)4PF2-, (CF3)5PF—, (CF3)6P—, SF5CF2SO3-, SF5CHFCF2SO3-, CF3CF2(CF3)2CO—, (CF3SO2)2CH—, (SF5)3C—, and (O(CF3)2C2(CF3)2O)2PO—.

The polymer ionic liquid may contain a repeating unit including the cation and the anion described above. Examples of the polymer ionic liquid may include a compound represented by Formula 1 or a compound represented by Formula 2:

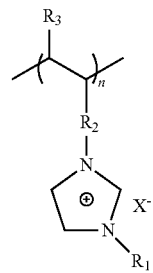

Formula 1

In Formula 1, R1 and R3 are each independently a hydrogen, a substituted or unsubstituted C1-C30 alkyl group, a substituted or unsubstituted C2-C30 alkenyl group, a substituted or unsubstituted C2-C30 alkynyl group, a substituted or unsubstituted C6-C30 aryl group, a substituted or unsubstituted C2-C30 heteroaryl group, or a substituted or unsubstituted C4-C30 carbon ring. In Formula 1, R2 simply denotes a chemical bond or is a C1-C3 alkylene group, a C6-C30 arylene group, a C2-C30 heteroarylenen group, or a C4-C30 carbon ring, X— is an anion of the ionic liquid, and n is a number in a range of 500 to 2800.

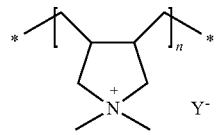

Formula 2

In Formula 2, Y— is defined the same with X— in Formula 1, and n is a number in a range of 500 to 2800.

In Formula 2, Y— is, for example, bis(trifluoromethanesulfonyl)imide (TFSI), bis(fluoromethanesulfonyl)imide, BF4, or CF3SO3.

For example, the polymer ionic liquid may include a cation selected from poly(1-vinyl-3-alkylimidazolium), poly(1-allyl-3-alkylimidazolium), and poly(1-(methacryloyloxy-3-alkylimidazolium)); and an anion selected from CH3COO—, CF3COO—, CH3SO3-, CF3SO3-, (CF3SO2)2N—, (FSO2)2N—, (CF3SO2)3C—, (CF3CF2SO2)2N—, C4F9SO3-, C3F7COO—, and (CF3SO2)(CF3CO)N—.

The compound represented by Formula 2 may be polydiallyldimethylammonium bis(trifluoromethanesulfonyl)imide.

The organic composite layer may be acid-treated. During the acid-treatment, nitric acid, sulfuric acid, chloroauric acid (HAuCl4), or hydrochloric acid may be used as an acid, and a concentration of the acid may be in a range of, for example, about 35 weight % to about 85 weight %, for example, about 35 weight % to about 75 weight %, or, for example, about 35 weight % or 67.5 weight % to about 70 weight %. For example, the acid-treatment of the organic composite layer may be carried out by immersing the resultant of coating and drying a composition for forming an organic composite layer in an acid solution.

The acid-treated organic composite layer may have an improved conductivity as impurities are removed from the organic composite layer.

The conductive composite structure may have a sheet resistance of about 1,000 Ω/square or lower, or, for example, in a range of about 500 Ω/square to about 1,000 Ω/square.

A contact angle with water of the organic composite layer may be less than 100°, or, for example, in a range of about 70° to about 90°, and a contact angle with water of graphene may be about 100°.

The organic composite layer may include at least one selected from PEDOT:PSS; acid-treated PEDOT:PSS; acid-treated PEDOT:PSS and an ionic liquid; PEDOT:PSS and an ionic liquid; PEDOT:PSS and Nafion; acid-treated PEDOT:PSS and Nafion; acid-treated PEDOT:PSS, an ionic liquid, and Nafion; and PEDOT:PSS, an ionic liquid, and Nafion.

The conductive composite structure may further include at least one supporting member selected from the group consisting of glass, quartz, silicon/silicon oxide, polyethylenterephthalate, polycarbonate, polyethylene naphthalate, polystyrene, polyimides, and celluloses.

The graphene may include a conductive polymer; a conductive polymer and Nafion; or a conductive polymer, Nafion, and a dopant. These materials may exist in the graphene, for example, by forming an organic composite layer on the graphene and dopant-treating the resultant. Here, the dopant may be a dopant having an electron receiving group. An example of this dopant may be at least one p-type dopant selected from gold chloride, nitric acid, and an ionic liquid.

As shown in FIG. 1A, the conductive polymer according to an embodiment may have a structure in which an organic composite layer 11 is stacked on a supporting member 10, and graphene 12 is stacked thereon. When the graphene 12 is stacked on the organic composite layer 11 by transferring the graphene 12 after acid-treating and/or adding a dopant on the organic composite layer 11, a p-type doping effect may be obtained, and the graphene layer may serve as a passivation layer that maintains a dopant component and prevents oxidation.

Figure 1B:
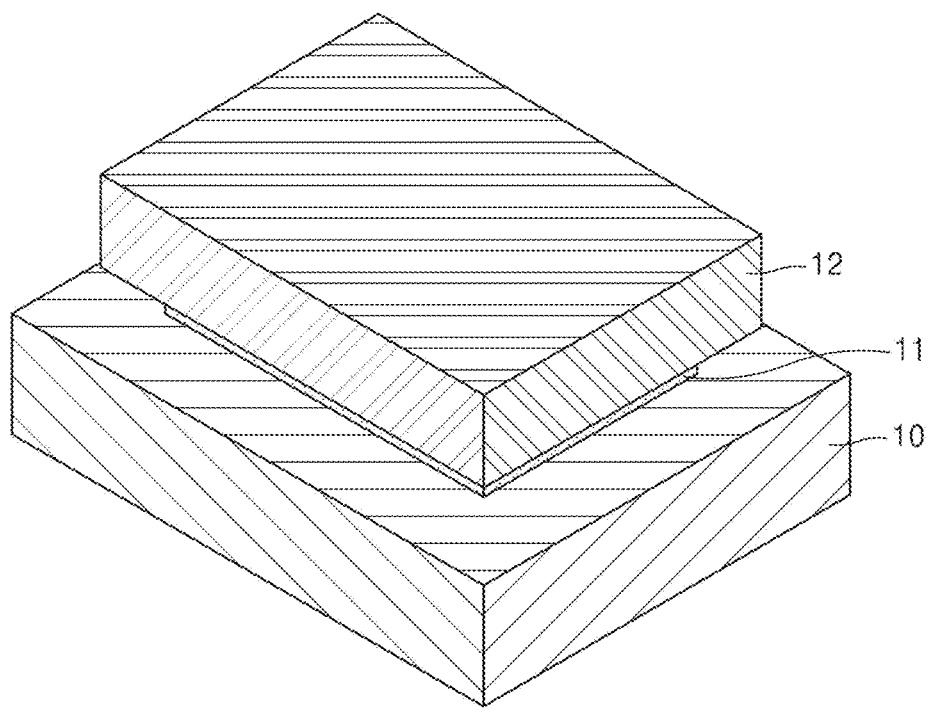
FIG. 1B shows a stacked structure of a conductive composite structure according to another embodiment.

As shown in FIG. 1B, the conductive polymer according to an embodiment may have a structure in which the graphene 12 is disposed on the supporting member 10, and the organic composite layer 11 is stacked thereon. In the conductive composite structure for an electronic device having the stack structure shown in FIG. 1B, electrons may migrate from the graphene 12 to the organic composite layer 11 having a high work function. The organic composite layer 11 may be, for example, acid-treated or doped with a dopant, and thus a conductivity of the conductive composite structure may increase. Also, the graphene 12 may be partially torn or may have an empty space during growing process, and thus the graphene 12 may serve as a charge moving layer at this region. Also, when the conductive composite structure is used as an electrode, a work function at a surface of the electrode may increase than a work function of the graphene (4.2 eV to 4.8 eV). Graphene may be further stacked on the organic composite layer 11.

Figure 1C:
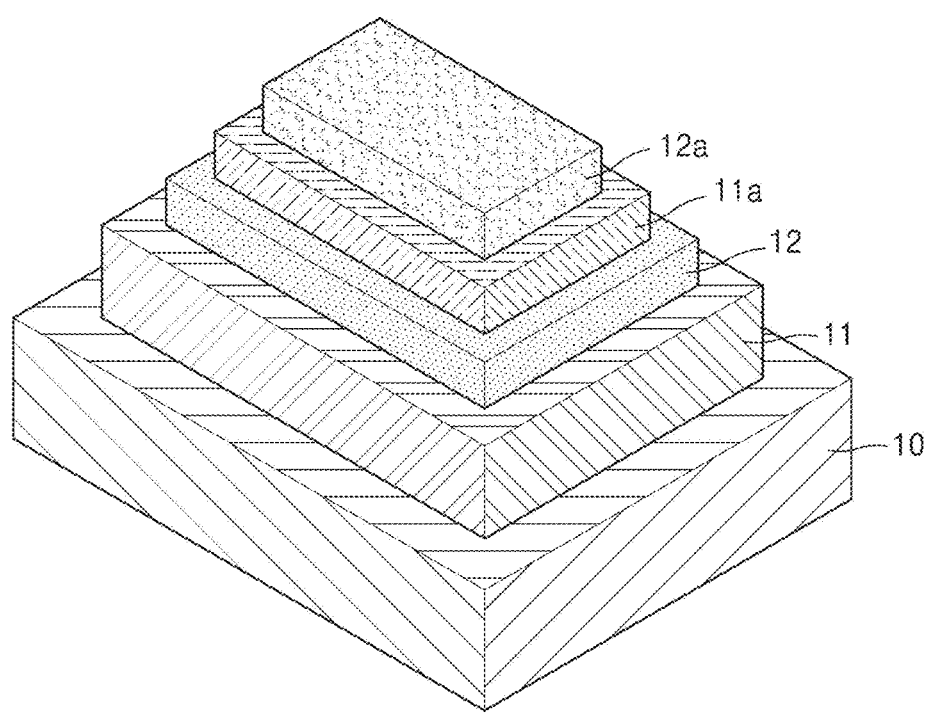
FIG. 1C shows a stacked structure of a conductive composite structure having a multi-layer structure.

FIG. 1C shows a stack structure of the conductive composite structure having a multi-layer structure. Referring to FIG. 1C, the stack structure includes a first organic composite layer 11, a first graphene 12, a second organic composite layer 11a, and a second graphene 12a that are sequentially stacked on a supporting member 10. Here, the first organic composite layer 11 and the second organic composite layer 11a may serve as binding layers. A hydrophilic group such as a hydroxyl group may exist on a surface of the supporting member 10, which may serve as a binding layer when the first organic composite layer 11 is coated as a binding strength increases due to an attractive force between the hydrophilic group on a surface of the supporting member 10 and a conductive polymer (PEDOT:PSS) of the first organic composite layer 11. Also, the first organic composite layer 11 and the second organic composite layer 11a contains an organic material, which may produce an aging effect in the air, and thus the first organic composite layer 11 and the second organic composite layer 11a may have sufficient conductivities and improved work function characteristics. Further, when the first organic composite layer 11 and the second organic composite layer 11a are doped with a dopant, the first organic composite layer 11 and the second organic composite layer 11a may be evenly coated on the supporting member 10 and the first graphene 12 which are below the first organic composite layer 11 and the second organic composite layer 11a.

Hereinafter, according to another embodiment, a method of preparing the conductive composite structure will be described.

The conductive composite structure first undergoes mixing of a conductive polymer having a work function of about 5.3 eV or lower, isopropyl alcohol, and an organic solvent that is miscible with isopropyl alcohol to prepare a composition for forming an organic composite layer.

If it is needed, water may be added during the preparation of the composition.

Subsequently, the method includes coating and drying of the composition for forming an organic composite layer on a supporting member or graphene. The coating may be performed by using at least one selected from spin coating, dip coating, bar coating, spray coating, and inkjet coating.

The drying may be performed at a temperature in a range of room temperature (25° C.) to about 120° C.

The composition for forming an organic composite layer does not include a surfactant, the isopropyl alcohol and the organic solvent miscible with isopropyl alcohol are mixed within predetermined (or alternatively, desired) ranges, and thus the coating is evenly performed on hydrophobic graphene. Through this coating process, a conductivity of the organic composite layer may improve, and a conductive polymer of the composition for an organic composite layer may exist in graphene, which may result in improvement of conductivity at regions where graphene is partially damaged or lost during a transferring process.

An amount of the isopropyl alcohol may be in a range of about 50 parts to about 500 parts by volume, or, for example, about 100 parts to about 5000 parts by volume, based on 100 parts by volume of the conductive polymer. When the amount of the isopropyl alcohol is within these ranges, the organic composite layer including the hydrophilic conductive polymer may be coated on graphene, and a thickness of the organic composite layer may be controlled to a desired thickness.

An amount of the organic solvent that is miscible with isopropyl alcohol may be about 5 parts by volume or less, or, for example, in a range of about 0.01 parts to about 5 parts by volume, based on 100 parts by volume of the total volume of the conductive polymer having a work function of about 5.3 eV or lower and isopropyl alcohol. When the amount of the organic solvent that is miscible with isopropyl alcohol is within this range, a viscosity of the composition for forming an organic composite layer may be appropriately controlled so that coating of graphene may be performed, and a conductivity of the organic composite layer may increase.

According to this process described above, the conductive polymer may be included in the graphene.

After the coating and drying of the composition for forming an organic composite layer on the supporting member or graphene, the resultant of the coating and drying of the composition for forming an organic composite layer may be acid-treated. When this acid-treatment is carried out, an insulator may be removed from the organic composite layer, and thus a conductivity of the organic composite layer may improve.

Next, the method may include providing Nafion and a dopant-containing composition to the resultant of the acid-treatment, wherein the dopant-containing composition includes at least one dopant selected from an ionic liquid, a polymer ionic liquid, and gold chloride; and an organic solvent. The organic solvent may be at least one selected from the group consisting of ethylene glycol, dimethylsulfoxide, glycerol, N,N-dimethylformamide, sorbitol, N-methylpyrrolidone, nitromethane, acetonitrile, and methanol.

After the coating and drying of the composition for forming an organic composite layer on the supporting member or graphene, the method may include providing Nafion and a dopant-containing composition including at least one dopant selected from an ionic liquid, a polymer ionic liquid, and gold chloride; and an organic solvent to the resultant of the coating and drying of the composition for forming an organic composite layer without undergoing the acid-treating process. According to this process described above, the conductive polymer and an ionic liquid may be included in the graphene.

The organic solvent miscible with isopropyl alcohol may be at least one selected from glycerol, polyethyleneglycol, dimethylsulfoxide, and sorbitol. An amount of the organic solvent may be about 5 volume % or less. When the amount of the organic solvent is about 5 volume % or less, a conductivity improving effect of the conductive composite structure may be sufficient.

According to another embodiment, an electrode for an electronic device includes the conductive composite structure. The electrode is a transparent electrode, which may replace a conventional graphene electrode and thus has improved transparency and conductivity characteristics.

According to another embodiment, an electronic device includes the conductive composite structure.

The conductive composite structure may be used as a transparent electrode that replaces an ITO electrode or an FTO electrode used as a conventional transparent electrode for an electronic device. The conductive composite structure may be used as a functional layer such as a hole injection layer or a hole transport layer of an organic light-emitting device or may be used as an electrode of a battery.

The electronic device may be, for example, an organic light-emitting device, an organic photovoltaic (OPV) cell, an organic energy storage (OES) device, or an organic thin-film transistor.

The conductive composite structure according to an embodiment may be used as an electrode of a flexible electronic device.

Figure 11:
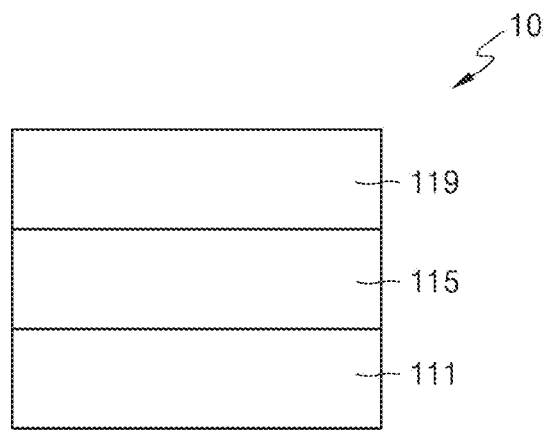
FIG. 11 is a schematic cross-sectional view of an organic light-emitting device including the conductive composite structure, according to an embodiment.

FIG. 11 is a schematic cross-sectional view of an organic light-emitting device 110 according to an embodiment. Hereinafter, a structure and a method of preparing the organic light-emitting device 110 according to an embodiment will be described as follows. The organic light-emitting device 110 has a structure in which a first electrode 111, an organic layer 115, and a second electrode 119 are sequentially stacked in this stated order.

A substrate may be further disposed under the first electrode 111 or on the second electrode 119. The substrate may be a material generally used in an organic light-emitting device, which may be a glass substrate or a transparent plastic substrate that has excellent mechanical strength, thermal stability, transparency, surface flatness, ease in use, and waterproofness.

For example, the first electrode 111 may be formed on the substrate by providing a material for a first electrode using a deposition method or a sputtering method. The first electrode may be an anode. The material for a first electrode may be selected from materials having a high work function to facilitate injection of holes. The first electrode 111 may be a reflective electrode, a semi-reflective electrode, or a transparent electrode. The conductive composite structure according to an embodiment may be used as the first electrode 111.

The first electrode 111 may have a multi-layer structure including a single layer or at least two layers. For example, the first electrode 11 may have a structure of a composite structure/ITO or a three-layered structure of a conductive composite structure/Ag/ITO, but embodiments are not limited thereto.

The organic layer 115 is disposed on the first electrode 111. The conductive composite structure according to an embodiment may be used as the organic layer 115.

The organic layer 115 may include a hole transport region; an emission layer; and/or an electron transport region.

The hole transport region may be disposed between the first electrode 111 and the emission layer (EML).

The hole transport region may include at least one selected from a hole injection layer, a hole transport layer, an electron blocking layer, and a buffer layer.

The hole transport region may solely include a hole injection layer or may solely include a hole transport layer. Also, the hole transport region may have a structure in which a hole injection layer/a hole transport layer or a hole injection layer/a hole transport layer/an electron blocking layer is sequentially stacked on the first electrode 111.

When the hole transport region includes a hole injection layer, the hole injection layer may be formed on the first electrode 111 by using various methods such as a vacuum deposition method, a spin coating method, a cast method, or an LB method.

The conditions for forming the hole transport layer and the electron blocking layer may refer to the conditions for forming the hole injection layer.

The emission layer (EML) may be formed on the hole transport region by using a vacuum deposition method, a spin coating method, a cast method, or an LB method. When the EML is formed by using a vacuum deposition method and a spin coating method, the conditions of deposition and the conditions of coating may be generally selected from the same conditions for forming the hole injection layer although they may differ according to compounds.

When the organic light-emitting device is a full-color organic light-emitting device, the emission layer may be patterned to a red emission layer, a green emission layer, and a blue emission layer. Also, the emission layer (EML) may have a structure in which the red emission layer, the green emission layer, and/or the blue emission layer are stacked, and thus embodiments may vary such as white light may be emitted.

A thickness of the emission layer may be in a range of about 100 Å to about 1,000 Å, or, for example, about 200 Å to about 600 Å. When the thickness of the emission layer is within these ranges, light-emitting characteristics may be excellent without substantially increasing a driving voltage.

Next, an electron transport region is disposed on the emission layer.

The electron transport region may include at least one selected from a hole blocking layer, an electron transport layer, and an electron injection layer.

For example, the electron transport region may have a structure of a hole blocking layer/an electron transport layer/an electron injection layer or an electron transport layer/an electron injection layer, but embodiments are not limited thereto. The electron transport layer may have a single layer or a multi-layer structure including at least two different materials.

Hereinafter, embodiments will be described in more detail with reference to Examples. However, these Examples are provided for illustrative purposes only, and the scope of the embodiments is not intended to be limited by these Examples.

Example 1 (Graphene/Organic Composite Layer)

A composition for forming an organic composite layer including 5 volume % of PEDOT:PSS, 95 volume % of isopropyl alcohol (IPA), and glycerol (GL) was spin-coated (at a rate of 5,000 rpm for 30 seconds) on graphene transferred according to a wet transfer method (hereinafter, also referred to as "wet-transferred graphene") (available from Seoul University Graphene Square), and this was dried at a temperature of 120° C. to form a conductive composite structure by stacking an organic composite layer on graphene. An amount of glycerol in the composition for forming an organic composite layer was about 5 volume % based on 100 volume % of the total volume of PEDOT:PSS and isopropyl alcohol.

Examples 2 to 9 and Comparative Examples 1 to 3 (Graphene/Organic Composite Layer)

A conductive composite structure was formed in the same manner as in Example 1, except that a volume ratio of PEDOT:PSS and isopropyl alcohol in the composition for an organic composite layer was changed to those shown in Table 1.

TABLE 1

|  | Amount of PEDOT:PSS (volume %) | Amount of IPA (volume %) | Amount of GL (volume %) | Volume ratio of PEDOT:PSS and IPA | Volume ratio of PEDOT:PSS/IPA |
| --- | --- | --- | --- | --- | --- |
| Example 2 | 20 | 80 | 5 | 1:4 | 0.25 |
| Example 3 | 14.3 | 85.7 | 5 | 1:6 | 0.17 |
| Example 4 | 11.49 | 88.51 | 5 | 1:7.7 | 0.13 |
| Example 5 | 7.7 | 92.3 | 5 | 1:12 | 0.083 |
| Example 6 | 5.65 | 94.35 | 5 | 1:16.7 | 0.063 |
| Example 6a | 40 | 60 | 5 | 1:1.5 | 0.67 |
| Example 6b | 33 | 67 | 5 | 1:2 | 0.5 |
| Example 6c | 4.8 | 95.2 | 5 | 1:20 | 0.05 |
| Comparative Example 1 | 100 | 0 | 5 | 100:0 | — |
| Comparative Example 2 | 10 | 90 | 0 | 10:0 | — |
| Comparative Example 3 | 33 | 67 | 0 | 1:2 | 0.5 |

The second electrode 119 is located on the organic layer 115. The second electrode 119 may be a cathode. A material for the second electrode 119 may be a metal, an alloy, an electric conductive compound, and a combination thereof which have a relatively low work function. Examples of the material for the second electrode 119 may include lithium (Li), magnesium (Mg), aluminum (Al), aluminum-lithium (Al—Li), calcium (Ca), magnesium-indium (Mg—In), and magnesium-silver (Mg—Ag). Also, the second electrode 119 may be formed as a transparent type by using ITO and IZO so that a top emission light-emitting device may be obtained, and embodiments may vary.

Thus, the organic light-emitting device has been described by referring to FIG. 11, but embodiments are not limited thereto.

The conductive composite structure prepared according to Comparative Example 1 increased a viscosity of the composition for an organic composite layer containing PEDOT:PSS, and the composition was in the form of gel, which made it difficult to evenly form the organic composite layer on graphene. The conductive composite structures prepared according to Comparative Examples 2 and 3 had resistance characteristics and resistance deviation of the conductive composite that would not reach desired levels.

Example 7 (Organic Composite Layer/Graphene)

A composition for forming an organic composite layer including 5 volume % of PEDOT:PSS (PSS: 1-1.4%), 95 volume % of isopropyl alcohol (IPA), and glycerol (GL) was spin-coated (at a rate of 5,000 rpm for 30 seconds) on glass, and this was dried at a temperature of 120° C. to form an organic composite layer on glass. An amount of glycerol in the composition for forming an organic composite layer was about 5 volume % based on 100 volume % of the total volume of PEDOT:PSS and isopropyl alcohol.

Wet-transferred graphene (a single layer) (available from Seoul University Graphene Square) was stacked on the organic composite layer to prepare a conductive composite structure.

Example 7a

A conductive composite structure was prepared in the same manner as in Example 1, except that Nafion was added to the composition for forming an organic composite layer. An amount of the Nafion was about 20 parts by weight based on 100 parts by weight of PEDOT:PSS.

The conductive composite structure prepared according to Example 7a had a reduced sheet resistance compared to that of Example 1.

Example 8

A composition for forming an organic composite layer including 5 volume % of PEDOT:PSS, 95 volume % of isopropyl alcohol (IPA), and glycerol (GL) was spin-coated (at a rate of 5,000 rpm for 30 seconds) on dry-transferred graphene, and this was dried to form a first organic composite layer on graphene. An amount of glycerol in the composition for forming an organic composite layer was about 5 volume % based on 100 volume % of the total volume of PEDOT:PSS and isopropyl alcohol.

The organic composite layer was acid-treated by immersing the first organic composite layer in a hydrochloric acid aqueous solution of about 35 weight %. An ionic liquid and a nitromethane solution of an ionic liquid including nitromethane (having a concentration of an ionic liquid of 20 mM) were spin coated on the acid-treated organic composite layer, and this was dried at a temperature of about 80° C. to form an organic composite layer doped with an ionic liquid.

Example 9

A composition for forming an organic composite layer including 33 volume % of PEDOT:PSS, 67 volume % of isopropyl alcohol (IPA), and glycerol (GL) was spin-coated (at a rate of 5,000 rpm for 30 seconds) on glass, and this was dried to form a first organic composite layer. An amount of glycerol in the composition for forming an organic composite layer was about 5 volume % based on 100 volume % of the total volume of PEDOT:PSS and isopropyl alcohol.

The first organic composite layer was acid-treated by immersing the first organic composite layer in a hydrochloric acid aqueous solution of about 35 weight %. An ionic liquid and a nitromethane solution of an ionic liquid including nitromethane (having a concentration of an ionic liquid of 20 mM) were spin coated on the acid-treated organic composite layer, and this was dried at a temperature of about 80° C. to form an organic composite layer doped with an ionic liquid. The dry-transferred graphene was stacked on the first organic composite layer, and a composition for forming a second organic composite layer including 12 volume % of PEDOT:PSS, 88 volume % of isopropyl alcohol (IPA), and glycerol (GL) was spin-coated (at a rate of 5,000 rpm for 30 seconds) thereon, and this was dried to form a second organic composite layer on graphene. An amount of glycerol in the composition for forming a second organic composite layer was about 5 volume % based on 100 volume % of the total volume of PEDOT:PSS and isopropyl alcohol.

A nitromethane solution of an ionic liquid including 95 volume % of ionic liquid and 5 volume % of nitromethane was spin-coated on the second organic composite layer thus obtained, and this was dried at 80° C. to form a second organic composite layer doped with an ionic liquid.

Dry-transferred graphene was stacked on the second organic composite layer to prepare a conductive composite structure having a four-layered structure on glass (see FIG. 1C).

Example 10

A conductive composite structure having a four-layered structure on glass was prepared in the same manner as in Example 9, except that a process of doping an ionic liquid to the acid-treated first organic composite layer in the preparation of the conductive composite structure was omitted.

Example 11

A conductive composite structure was prepared in the same manner as in Example 9, except that an acid-treating process of the first organic composite layer in the preparation of the conductive composite structure was omitted.

Example 12

A composition for forming an organic composite layer including 33 volume % of PEDOT:PSS, 67 volume % of isopropyl alcohol (IPA), and glycerol (GL) was spin-coated (at a rate of 5,000 rpm for 30 seconds) on glass, and this was dried to form a first organic composite layer. An amount of glycerol in the composition for forming an organic composite layer was about 5 volume % based on 100 volume % of the total volume of PEDOT:PSS and isopropyl alcohol.

The dry-transferred graphene was stacked on the first organic composite layer, and a composition for forming a second organic composite layer including 12 volume % of PEDOT:PSS, 88 volume % of isopropyl alcohol (IPA), and glycerol (GL) was spin-coated (at a rate of 5,000 rpm for 30 seconds) thereon, and this was dried at a temperature of about 120° C. to form a second organic composite layer on graphene. An amount of glycerol in the composition for forming a second organic composite layer was about 5 volume % based on 100 volume % of the total volume of PEDOT:PSS and isopropyl alcohol.

Dry-transferred graphene was stacked on the second organic composite layer thus obtained to prepare a conductive composite structure having a four-layered structure on glass (see FIG. 1C).

Evaluation Example 1: Measurement of Thickness and Sheet Resistance Characteristics Thicknesses and sheet resistances of the conductive composite structures prepared in Examples 2 to 6 were measured, and the results are shown in FIGS. 2 and 3.

Figure 2:
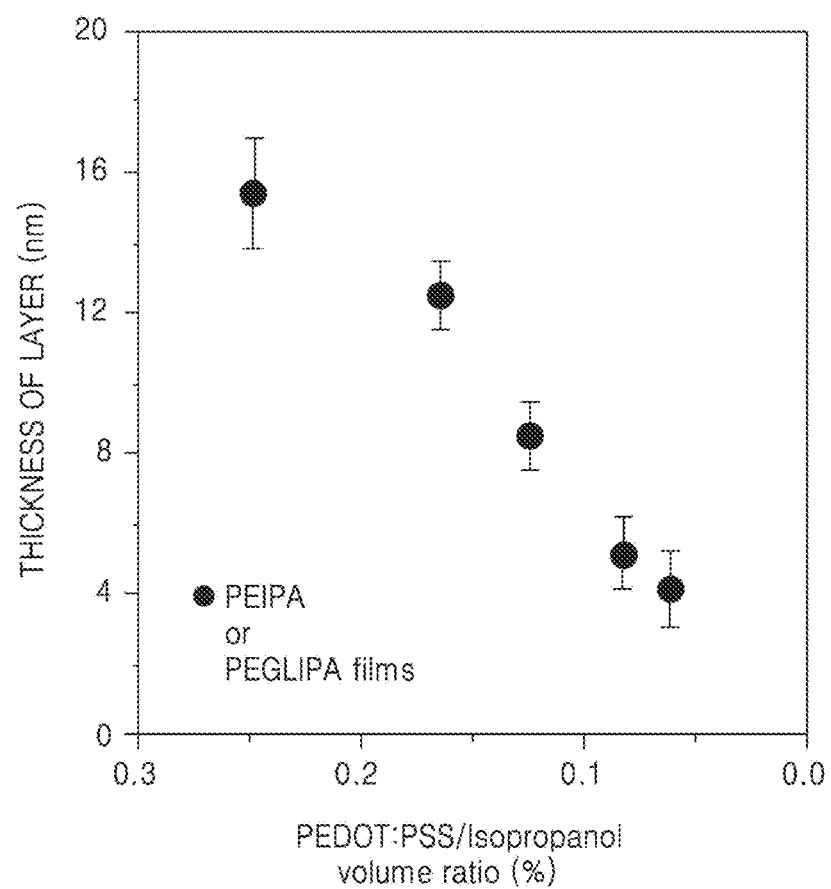
FIG. 2 shows thicknesses of conductive composite structures prepared according to Examples 2 to 6.
Figure 3:
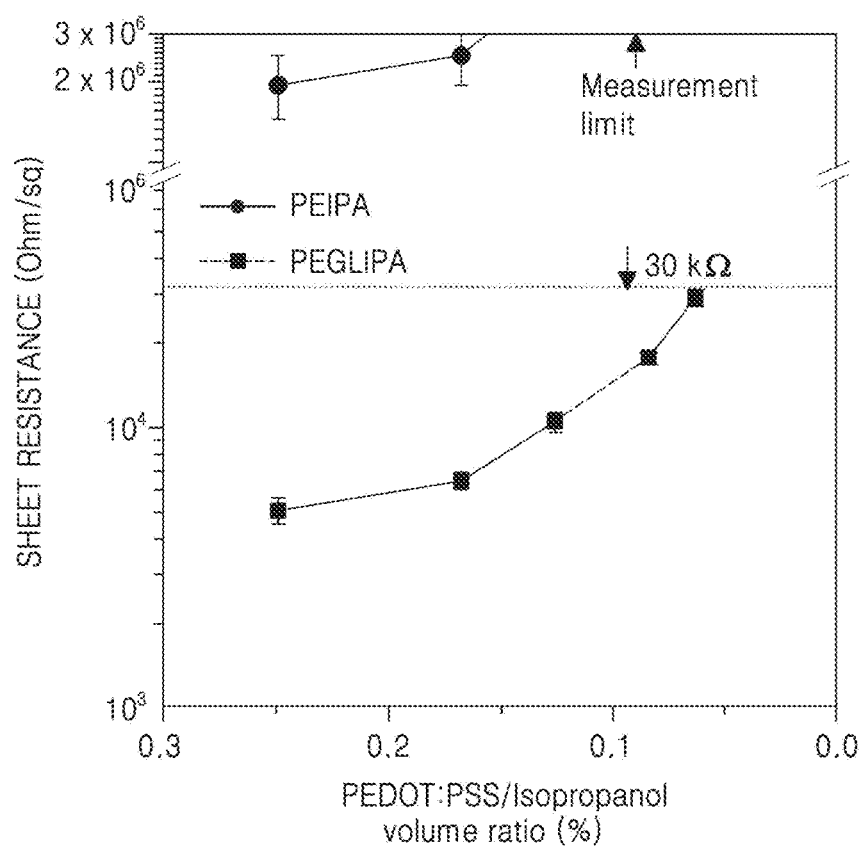
FIG. 3 shows sheet resistances of the conductive composite structures prepared according to Examples 2 to 6.

In FIGS. 2 and 3, when, for example, a volume ratio of PEDOT:PSS and IPA is 0.25 in X-axis, a volume ratio of PEDOT:PSS and IPA appeared to be 1:4.

Referring to FIG. 2, as an amount of IPA increases, it was confirmed that the organic composite layer had a decreased thickness and an increased resistance. In this regard, it was confirmed that when IPA and GL are used in the preparation of a conductive composite structure, a layer thickness may be easily controlled to a desired thickness, compared to those when other methods are used. Also, as shown in FIG. 3, it was confirmed that a sheet resistance increases as an amount of IPA increases, and that the sheet resistance characteristics of the organic composite layer are sufficient.

Also, resistances were measured at five regions of the conductive composite structure to evaluate a resistance deviation. The results of the resistance deviation are shown in Table 2.

TABLE 2

|  | Sheet resistance (Ω/square) | Sheet resistance deviation (%) |
| --- | --- | --- |
| Example 2 | 500 | 8.3 |
| Example 3 | 500 | 6.7 |
| Example 4 | 1,000 | 8.3 |
| Example 5 | 1,000 | 5 |
| Example 6 | 1,000 | 5 |
| Comparative Example 1 | 100 | 10 |
| Comparative Example 2 | Over 2 × 106 | Over 50 |

Referring to Table 2, the conductive composite structures of Examples 2 to 6 had reduced resistance deviations compared to those of Comparative Examples 1 and 2, and in this regard, it may be confirmed that the conductive composite structures of Examples 2 to 6 had consistent sheet resistance characteristics.

Evaluation Example 2: Work Function

Work functions of graphene composites prepared according to the conductive composite structures prepared in Examples 2 to 6 and Comparative Example 2 were measured by using an ultraviolet photoelectron spectroscopy (UPS). The results of measuring the work functions are shown in FIG. 3. In FIG. 3, the terms "PEIPA" and "PEGLIPA" represents those related to Comparative Example 2 and Example 2, each respectively.

Figure 4:
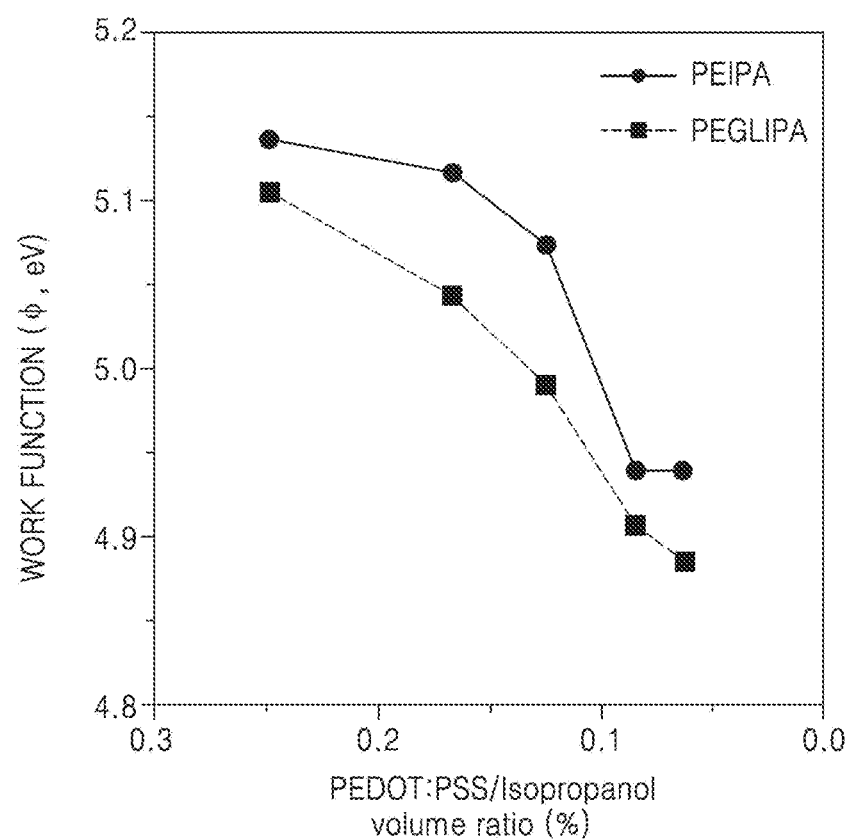
FIG. 4 shows work functions of the conductive composite structures prepared according to Examples 2 to 6.

Referring to FIG. 4, it was confirmed that the work function of the conductive composite structure of Example 2 changed and that it maintains a high work function of about 4.9 eV or higher.

Evaluation Example 3: Transparency and Conductivity

Figure 5:
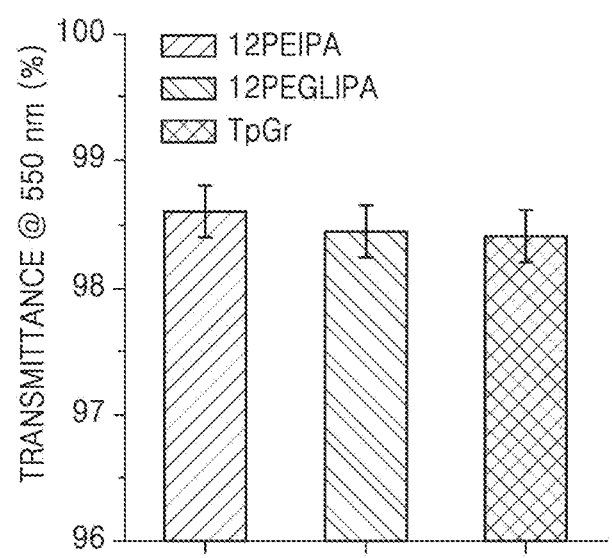
FIG. 5 shows transmittances of structures prepared according to Example 6 b and Comparative Example 3, and graphene having three layers or less (dry-transferred graphene)
Figure 6:
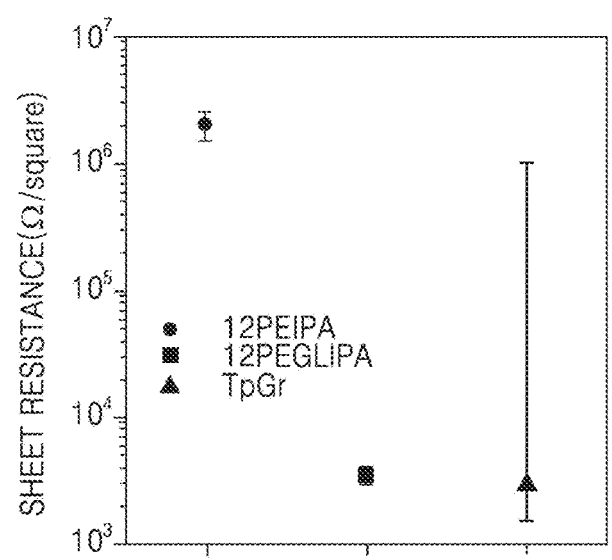
FIG. 6 shows sheet resistances of the structures prepared according to Example 6b and Comparative Example 3, and graphene having three layers or less (dry-transferred graphene)
Figure 7A:
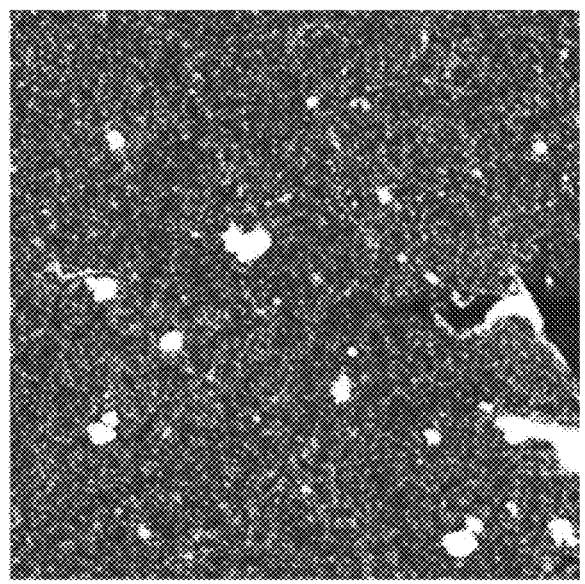
FIGS. 7A to 7D show the results of (atomic force microscopy) AFM analysis performed on the conductive composite structures prepared in Examples 3, 5, and 6 c and graphene having three layers or less (dry-transferred graphene)
Figure 7B:
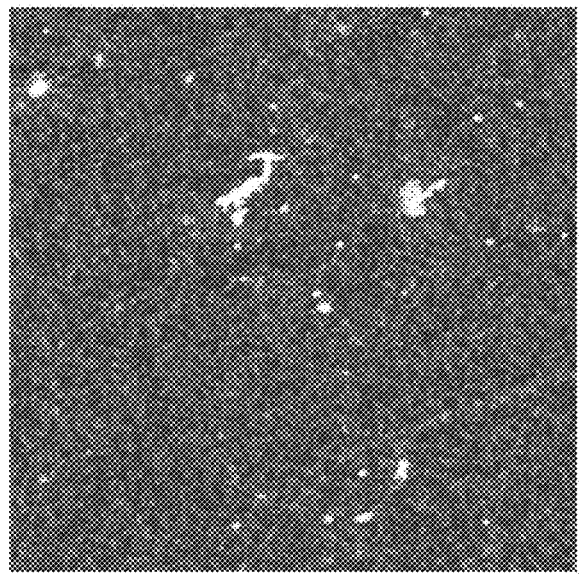
Figure 7C:
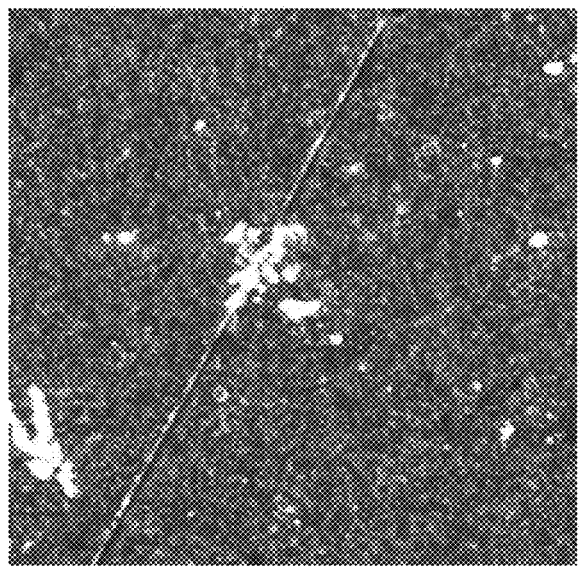
Figure 7D:
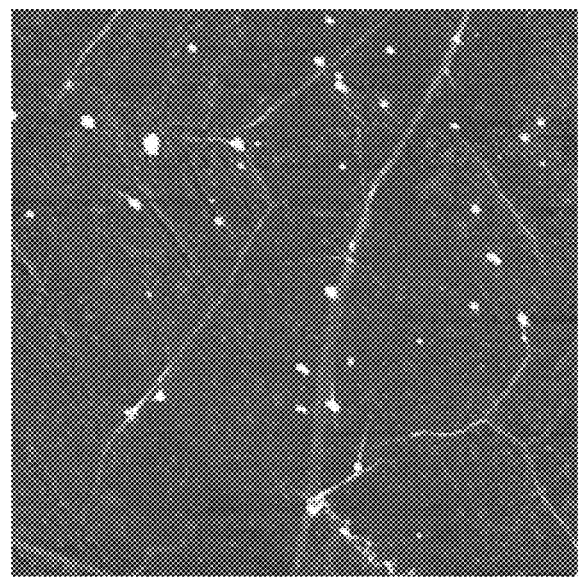
Figure 8A:
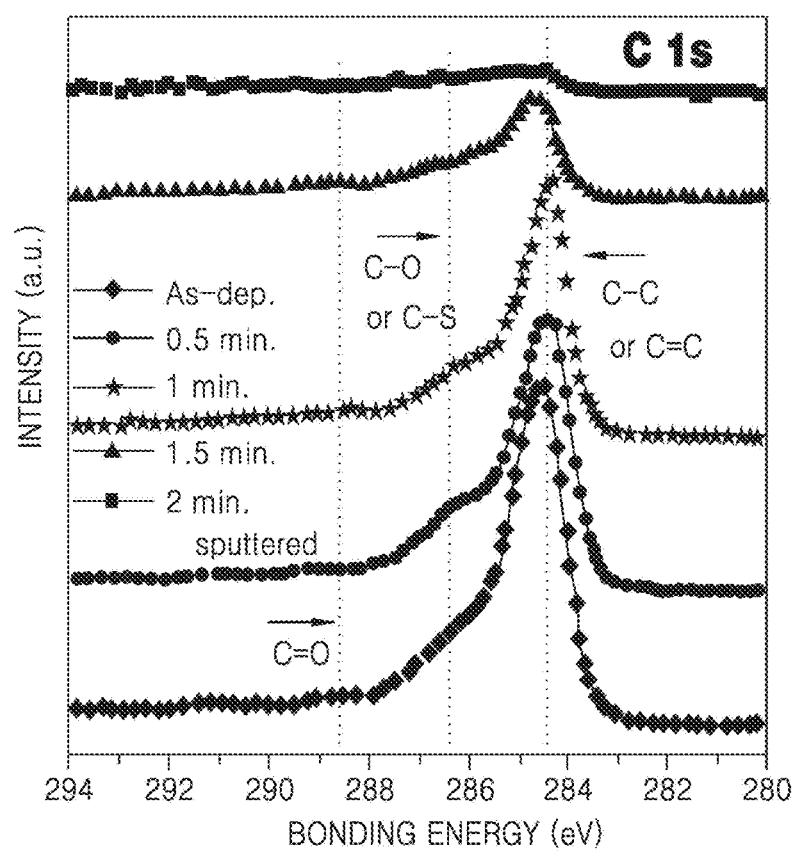
FIGS. 8A to 8D show the results of X-ray photoelectron spectroscopy (XPS) analysis performed on a graphene composite prepared in Example 8.
Figure 8B:
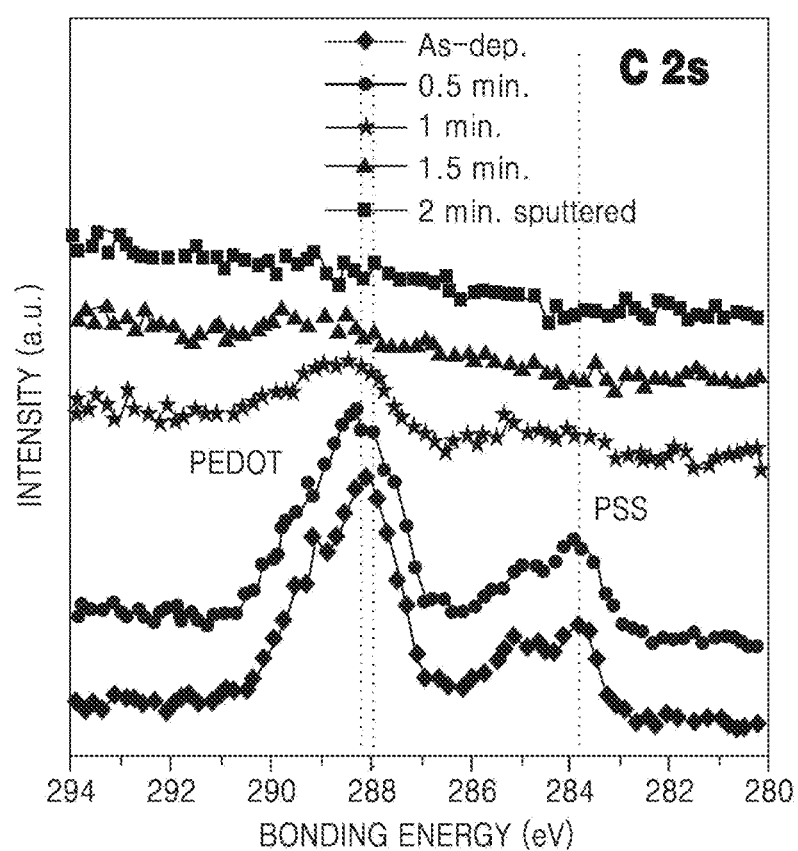
Figure 8C:
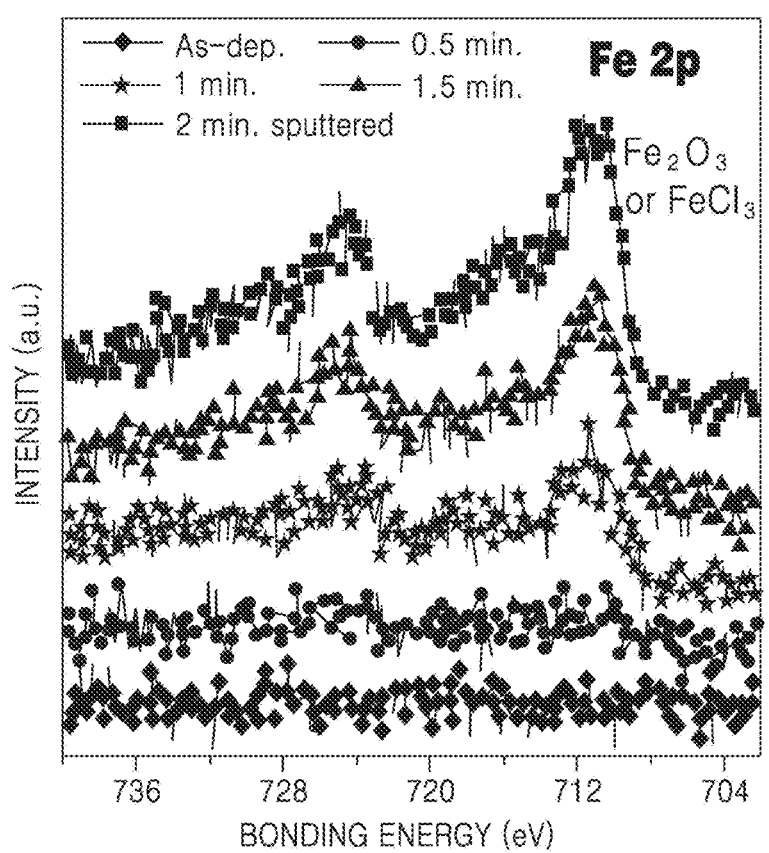
Figure 8D:
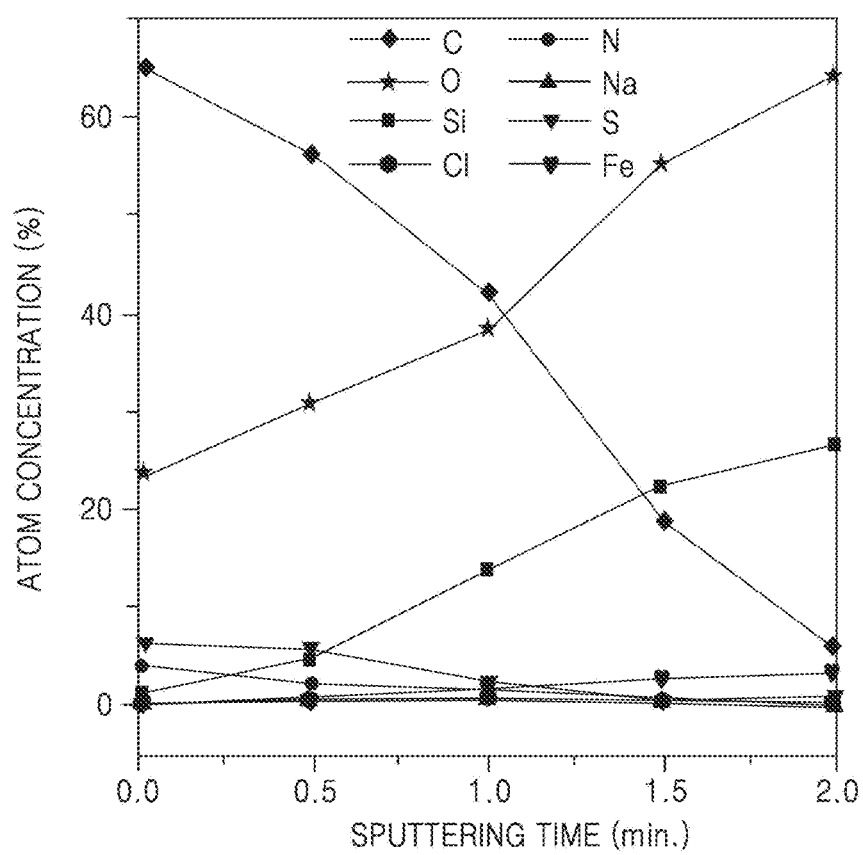

Transparencies and sheet resistances of the structures prepared according to Example 6b, Comparative Example 3, and graphene having three layers or less (dry-transferred graphene) were evaluated, and the results are shown in FIGS. 5 and 6. In FIGS. 5 and 6, 12PEIIPA and 12PEGLIPA represents those related to Example 6b and Comparative Example 3, each respectively, and TpGr is related to the dry-transferred graphene having three layers or less.

Referring to FIG. 5, optical transparency of the conductive composite structure of Example 6b was excellent as well as those of graphene that is transferred by using a dry-transfer method (hereinafter, also referred to as "dry-transferred graphene") and Comparative Example 3, and as shown in FIG. 6, it was confirmed that a resistance value of the conductive composite structure of Example 6b was secured to the level comparable with that of the graphene layer. Also, it was confirmed that a resistance value of the conductive composite structure of Example 6b was relatively uniform compared to that of the graphene having three layers or less.

Evaluation Example 4: Atomic Force Microscopy (AFM) Analysis and Surface Roughness Analysis The conductive composite structures of Examples 3, 5, and 6c and graphene having three layers or less (dry-transferred graphene) were prepared in a size of 5 μm×5 μm, and changes of their surface structures were observed by using an atomic force microscopy (AFM). The AFM analysis was performed by using AFM dimension icon (available from Bruker). The results of the AFM analysis are shown in FIGS. 7A to 7D.

Referring to FIGS. 7A to 7D, it was confirmed that the conductive composite structures of Examples 3, 5, and 6c had morphology different from that of the graphene having three layers or less. It was confirmed that the graphene having three layers or less may serve as a charge moving layer at a space torn or an empty space during a transferring/growing process.

Also, surface roughnesses of the conductive composite structures prepared in Examples 7 to 9 and wet-transferred graphene were obtained by analyzing surface shapes and roughnesses through SEM and AFM.

The results of surface roughness evaluation are shown in Table 3.

TABLE 3

|  | Surface roughness (Ra)(nm) |
| --- | --- |
| Example 3 | 2.2 |
| Example 5 | 3.1 |
| Example 6c | 4.2 |
| Comparative Example 1 | Over 1 nm |

Referring to Table 3, it was confirmed that surface roughnesses of the conductive composite structures of Examples 3, 5, and 6c were different as the morphologies of the surfaces are different, compared to that of Comparative Example 1.

Evaluation Example 5: X-Ray Photoelectron Spectroscopy (XPS) Analysis

X-ray photoelectron spectroscopy (XPS) analysis was performed on the graphene composite prepared in Example 8, and the results of the analysis are shown in FIGS. 8A to 8D. Referring to FIGS. 8A to 8D, formation of organic composite layers was confirmed through element analysis and chemical bond status analysis.

Evaluation Example 6: Sheet Resistance/Transmittance Evaluation

Figure 9A:
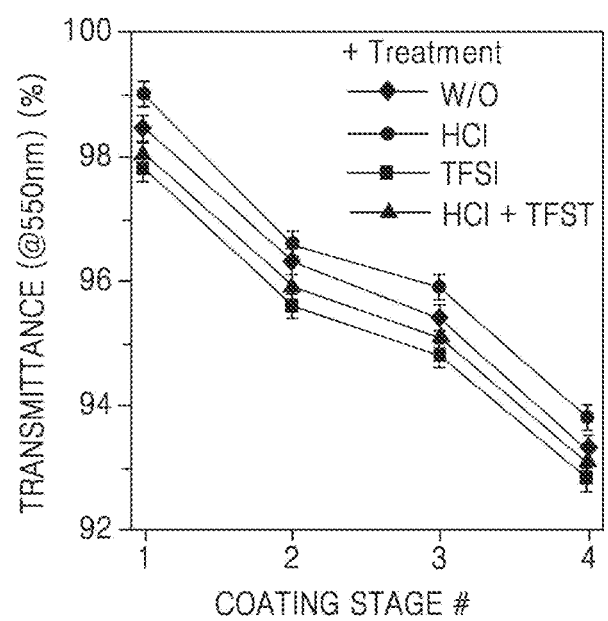
FIGS. 9A and 9B show transmittances and sheet resistances of conductive composite structures prepared in Examples 9 to 12.
Figure 9B:
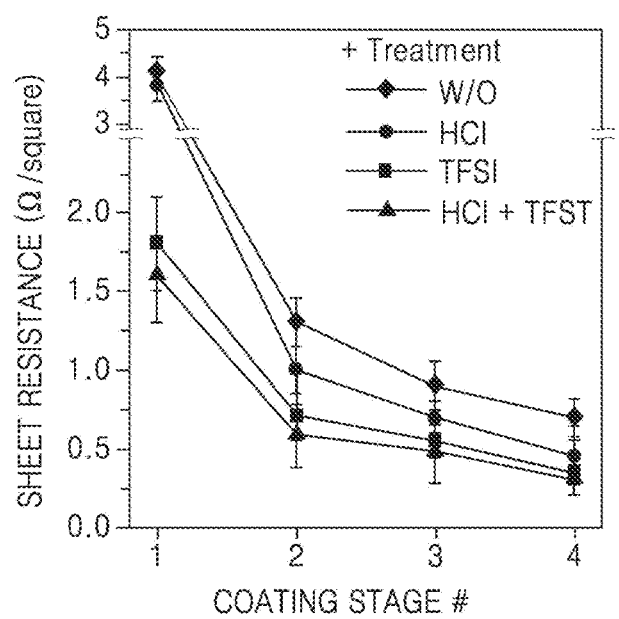

Transmittances of the conductive composite structures prepared in Examples 9 to 12 were measured by using a UV/Vis spectrometer at about 550 nm, and the results are shown in FIG. 9A. Sheet resistances of the conductive composite structures prepared in Examples 9 to 12 were measured, and the results are shown in FIG. 9B.

The conductive composite structures prepared in Examples 9 to 12 had excellent transmittances that may be suitable for a transparent electrode as shown in FIG. 9A. Also, referring to FIG. 9B, the conductive composite structures prepared in Examples 9 to 12 had excellent electrical conductivity as an electric conductivity of the organic composite layer improved, and an effect of doping on graphene was obtained. As shown in FIG. 9B, when the first organic composite layer was treated with both acid and ionic liquid while treating the second organic composite layer with an ionic liquid (Example 9) and when the first organic composite layer was treated with acid or ionic liquid while treating the second organic composite layer with an ionic liquid (Examples 10 and 11), sheet resistances had the lowest resistance values compared to the case when the first organic composite layer and the second organic composite layer are not treated with acid or ionic liquid (Example 12), and thus it was confirmed that sheet resistances of the conductive composite structures prepared in Examples 9 to 11 improved.

Evaluation Example 7: Conductivity after Storing in Air

The conductive composite structure obtained by stacking the first organic composite layer on graphene according to Example 8 was stored in air for 3 months, and states of the conductive composite structure before and after the 3 months of storage were evaluated by using a conductive atomic force microscopy (c-AFM). A voltage stress as applied to the conductive composite structure by using a c-AFM probe, and a current image of a data storage layer was obtained at a given voltage. The results of the evaluation are shown in FIGS. 10A and 10B.

Figure 10A:
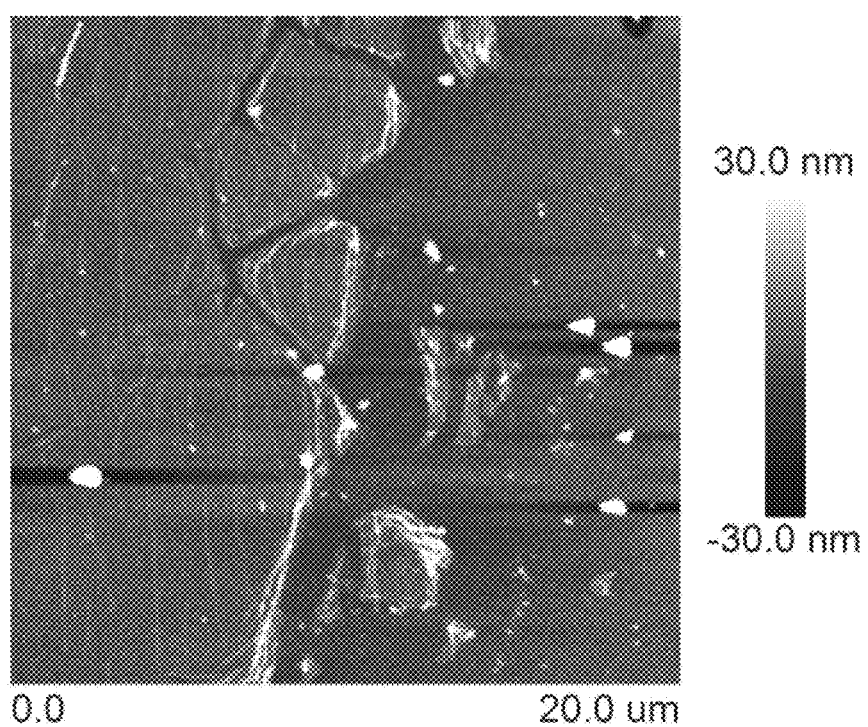
FIGS. 10A and 10B show images, obtained by conductive atomic force microscopy (c-AFM), for evaluating states of a conductive composite structure before and after storage of the conductive composite structure in air, respectively, wherein the conductive composite structure is obtained by stacking a first organic composite layer on graphene according to Example 8.
Figure 10B:
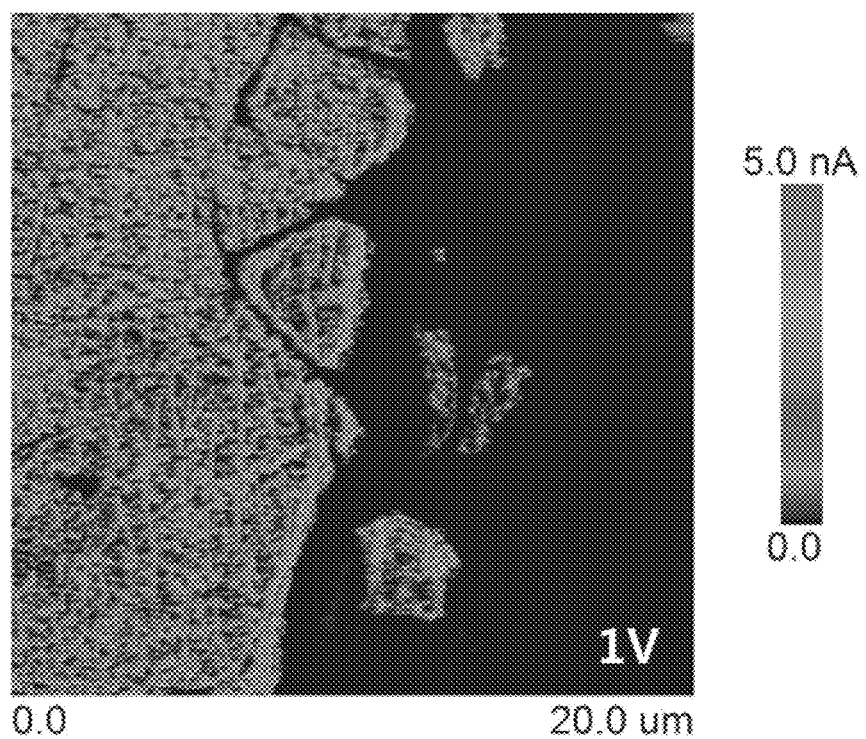

Referring to FIG. 10A, some regions of graphene in the conductive composite structure show damaged state at the edge. It was confirmed that electricity almost did not flow at the damaged region of graphene in the conductive composite structure after the 3 months of storage, whereas electricity flowed at a region covered with graphene.

As described above, according to one or more embodiments, a thickness of a conductive composite structure may be more easily controlled, and the conductive composite structure may have more consistent resistance characteristics. When the conductive composite structure is used, an electronic device may have improved performance.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A conductive composite structure comprising:
    graphene; and
    an organic composite layer comprising a conductive polymer having a work function of about 5.3 eV or lower,
    wherein the graphene is included in a layer stacked on the organic composite layer,
    wherein the organic composite layer has a thickness of 5 nm or less,
    wherein a sheet resistance deviation of the conductive composite structure is about 8.3% or less,
    wherein the sheet resistance of the conductive composite structure is in a range of about 500 Ω/square to about 1,000 Ω/square,
    wherein a surface roughness of the conductive composite structure is in a range of about 2 nm to about 5 nm, and
    wherein the organic composite layer comprises at least one selected from poly(3,4-ethylenedioxythiophene):poly(styrenesulfonate) (PEDOT:PSS), acid-treated PEDOT:PSS, acid-treated PEDOT:PSS and an ionic liquid, and PEDOT:PSS and the ionic liquid.

2. The conductive composite structure of claim 1, wherein the organic composite layer further comprises at least one dopant selected from the ionic liquid, a polymer ionic liquid, and a gold chloride, and an amount of the dopant is in a range of about 0.1 parts to about 20 parts by weight based on 100 parts by weight of the conductive polymer.

3. The conductive composite structure of claim 2, wherein the ionic liquid is at least one compound selected from compounds each comprising:
    i) at least one cation selected from an ammonium-based cation, a pyrrolidinium-based cation, a pyridinium-based cation, a pyrimidinium-based cation, an imidazolium-based cation, a piperidinium-based cation, a pyrazolium-based cation, an oxazolium-based cation, a pyridazinium-based cation, a phosphonium-based cation, a sulfonium-based cation, a triazolium-based cation, and a mixture thereof; and
    ii) at least one anion selected from BF4-, PF6-, AsF6-, SbF6-, AlCl4-, HSO4-, ClO4-, CH3SO3-, CF3CO2-, Cl—, Br—, I—, SO4-, CF3SO3-, (FSO2)2N—, (C2F5SO2)2N—, (C2F5SO2)(CF3SO2)N—, and (CF3SO2)2N—.

4. The conductive composite structure of claim 3, wherein the ionic liquid is at least one selected from N-methyl-N-propylpyrrolidinium bis(trifluoromethanesulfonyl)imide, N-butyl-N-methylpyrrolidinium bis(3-trifluoromethylsulfonyl)imide, 1-butyl-3-methylimidazolium bis(trifluoromethylsulfonyl)amide, and 1-ethyl-3-methylimidazolium bis(trifluoromethylsulfonyl)amide.

5. The conductive composite structure of claim 1, wherein the organic composite layer and/or the conductive composite structure is acid-treated.

6. The conductive composite structure of claim 1, wherein a contact angle of the organic composite layer with water is less than 100°.

7. The conductive composite structure of claim 1, wherein the graphene layer further comprises at least one of a conductive polymer or a dopant.

8. The conductive composite structure of claim 1, wherein the layer including the graphene is a passivation layer configured to protect the organic composite layer.

9. The conductive composite structure of claim 1, wherein the organic composite layer is between the graphene and at least one supporting member.

10. The conductive composite structure of claim 9, wherein the at least one supporting member includes at least one selected from the group consisting of glass, quartz, silicon/silicon oxide, polyethylenterephthalate, polycarbonate, polyethylene naphthalate, and polystyrene.

11. An electrode for an electronic device, the electrode comprising the conductive composite structure of claim 1.

12. An electronic device comprising the conductive composite structure of claim 1.

13. The electronic device of claim 12, wherein the electronic device is an organic light-emitting device, an organic photovoltaic (OPV) cell, an organic energy storage (OES) device, or an organic thin-film transistor.

* * * * *